United States Patent [19]

Niimura et al.

[11] 4,369,411
[45] Jan. 18, 1983

[54] CIRCUIT FOR CONVERTING SINGLE-ENDED INPUT SIGNALS TO A PAIR OF DIFFERENTIAL OUTPUT SIGNALS

[75] Inventors: Tsutomu Niimura; Kyoichi Murakami, both of Kanagawa; Akira Yamakoshi, Saitama, all of Japan

[73] Assignee: Sony Corporation, Tokyo, Japan

[21] Appl. No.: 186,566

[22] Filed: Sep. 12, 1980

[30] Foreign Application Priority Data

Sep. 18, 1979 [JP] Japan .................. 54-119921

[51] Int. Cl.$^3$ ............................................. H03F 3/45
[52] U.S. Cl. .................................. 330/257; 330/288; 330/301
[58] Field of Search ............... 330/257, 275, 288, 301

[56] References Cited

U.S. PATENT DOCUMENTS

4,001,706  1/1977  Pains et al. ............... 330/301 X
4,049,977  9/1977  Radovsky .................. 330/288 X Primary Examiner—James B. Mullins
Attorney, Agent, or Firm—Lewis H. Eslinger; Alvin Sinderbrand

[57] ABSTRACT

A signal converting circuit for converting a single-ended input signal to a pair of differential output signals includes a current source for generating a constant current; an input signal generating circuit for generating an input signal current; a first path including at least one diode connected to the current source and the input signal generating circuit for producing a first differential current as a function of the constant current and the input signal current; a second path including a series combination of a diode and the collector-emitter path of a transistor connected to the current source and the input signal generating circuit for producing a second differential current as a function of the constant current and the input signal current, the transistor being supplied with a current at its input; a differential amplifier output circuit having two transistors connected to the first and second paths for producing differential output signals in response to the first and second differential currents; and a circuit for eliminating the effect on the differential output signals of the current at the input of the transistor, the circuit for eliminating including a transistor having its collector-emitter path connected between the first path and ground and a diode connected between the second path and ground.

21 Claims, 9 Drawing Figures

CIRCUIT FOR CONVERTING SINGLE-ENDED INPUT SIGNALS TO A PAIR OF DIFFERENTIAL OUTPUT SIGNALS

BACKGROUND OF THE INVENTION

1. Field of the Invention

The present invention relates generally to a signal converting circuit and, more particularly, is directed to a signal converting circuit for converting a single-ended input signal into a differential output signal.

2. Description of the Prior Art

Signal converting circuits, for example, of the differential amplifier type, for converting a single-ended input signal into a differential output signal are well-known in the art. One such signal converting circuit includes a pair of transistors which form a differential amplifier. A DC bias is applied to the bases of the transistors and one of the transistor bases is grounded to eliminate any effect from alternating current. Further, a signal voltage is applied to the base of the non-grounded transistor and a differential output is derived from the collectors of the two transistors. However, since a bias circuit is required with such differential amplifier, the circuit construction becomes relatively complicated and the voltage source for the transistors cannot be effectively utilized.

One known circuit that has attempted to eliminate the problems in the above-described circuit so as to effectively utilize the voltage source without using a bias circuit, includes a first transistor having its base connected to ground through a pair of series diodes through which a constant current flows. A second transistor has its base connected to the emitter of the first transistor and to ground through a diode, and is further supplied thereat with a signal current. With this circuit, differential output currents are generated at the collectors of the two transistors. However, in order for this circuit to operate properly, the constant current supplied to the pair of series diodes must be much greater than the signal current. If this condition is not satisfied, the differential output currents produced at the collectors of the transistors become distorted. Further, in such circuit, the constant current cannot effectively be increased to satisfy the condition where the constant current is much greater than the signal current.

Another circuit is attempted in our copending application Ser. No. 83,858, which has matured into U.S. Pat. No. 4,292,597 to solve the problem in the above-identified circuit and, as such, produces no distorted output signals regardless of the relationship of the constant current and signal current and can be used with a relatively low voltage source. In such circuit, a constant current flows through a first path of two diodes connected in series and through a second path comprised of a diode and the collector-emitter path of a transistor connected in series. The signal current is supplied to the connection point between the two diodes of the first path, to the base of the transistor in the second path and to a second transistor. The collector of the first transistor is also connected to the base of a third transistor and differential output currents are produced at the collectors of the second and third transistors. In this circuit, the output currents at the collectors of the second and third transistors are not distorted, regardless of the relationship between the constant current and the signal current. Further, since this circuit does not require a bias circuit, the construction of the circuit is relatively simple and requires only a low voltage source. However, the differential output currents are affected by the base current of the first transistor and the base currents of the diodes when the latter are constructed from transistors having the collectors connected to the respective bases thereof. This means that the differential output currents will be affected by an undesirable off-set current which is a function of such base currents. This is also the case where the above circuit is modified so that a bias voltage source is connected between the first and second signal paths and ground and a constant current source is connected between the emitters of the second and third transistors and ground.

OBJECTS AND SUMMARY OF THE INVENTION

Accordingly, it is a principal object of this invention to provide a signal converting circuit which avoids the above-described difficulties encountered in the prior art and the aforementioned copending U.S. Pat. No. 4,292,597.

More particularly, it is an object of this invention to provide a signal converting circuit which produces differential output currents which are not affected by the base currents of any transistors used in the circuit.

Another object of this invention is to provide a signal converting circuit in which the gain thereof can be controlled by varying one or more constant current sources.

Still another object of this invention is to provide a signal converting circuit which eliminates the necessity of utilizing a bias voltage source.

Yet another object of this invention is to provide a signal converting circuit which effectively utilizes a relatively low voltage source for the transistors in the circuit.

In accordance with an aspect of this invention, a signal converting circuit includes current source means for generating a constant current; input signal generating means for generating an input signal current; first means for producing a first differential current as a function of the constant current and the input signal current; second means for producing a second differential current as a function of the constant current and the input signal current, with at least one of the first and second means including a transistor having an input and supplied with a current at its input; output means for producing differential output signals in response to the first and second differential currents; and means for for eliminating the effect on the differential output signal of the current at the input of the transistor.

The other objects, features and advantages of the invention, will be apparent in the following detailed description of illustrative embodiments of the invention which is to be read in connection with the accompanying drawings.

DETAILED DESCRIPTION OF THE PREFERRED EMBODIMENTS

Figure 1:
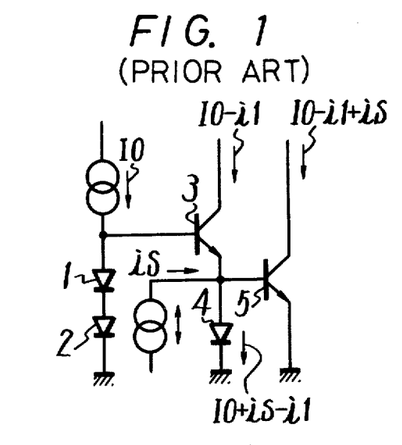
FIG. 1 is a circuit wiring diagram of a signal converting circuit according to the prior art.

Referring to the drawings in detail, and initially to FIG. 1 thereof, there is shown a signal converting circuit according to the prior art. As shown therein, the prior art signal converting circuit includes first and second diodes 1 and 2, respectively, connected in series, in the forward biasing direction thereof, between a constant current source which generates a constant current $I_O$ and ground. A voltage drop is generated across the series connection of diodes 1 and 2 as a result of the current flow therethrough from such constant current source and the generated voltage is supplied to the base of an NPN transistor 3. The emitter of transistor 3 is connected to ground through a diode 4, arranged in the forward biasing direction thereof, and to the base of a second NPN transistor 5 having its emitter connected to ground. It should be appreciated, however, that diodes 1, 2 and 4 are preferably formed of NPN transistors having the bases thereof connected to the respective collectors. Thus, diodes 1, 2 and 4 and transistors 3 and 5 can be formed as an integrated circuit on a common semiconductor wafer with, for example, the emitter area of each of the elements being equal.

A signal current $i_s$ is applied to the connection point between diode 4 and transistors 3 and 5. Accordingly, a voltage drop is developed across diode 4 as a result of signal $i_s$ and the current across transistor 3, and such voltage is applied to the base of transistor 5. When the signal current $i_s$ is equal to zero, constant current $I_O$ flows through each of the series combination of diodes 1 and 2, the series combination of the collector-emitter path of transistor 3 and diode 4, and through the collector-emitter path of transistor 5. It is to be realized, however, that although the collector and emitter currents of transistor 3 are not exactly equal, the difference therebetween is substantially negligible so that a current flow through the collector-emitter path of transistor 3 can be approximated as $I_O$. In like manner, the same analysis applies in regard to transistor 5. However, when signal current $i_s$ is not equal to zero, the current flow through the collector-emitter path of transistors 3 and 5 changes. In particular, in such case, the current flow through diodes 1 and 2 remains equal to $I_O$, but the collector-emitter current through transistor 3 is reduced to a value of $I_O - i_1$ as a result of the addition of signal current $i_s$ at the connection point between transistor 3 and diode 4. This means that the current flow through diode 4 is substantially equal to $(I_O - i_1 + i_s)$. The base current through transistor 5 is relatively small in comparison thereto. However, since the base-emitter voltage drops across transistor 5 and transistor-type diode 4 are equal, the current flowing through the emitter leg of transistor 5 must be equal to the current flowing through diode 4. Thus, since the collector and emitter currents of transistor 5 are substantially equal, such collector current is effectively equal to $(I_O - i_1 + i_s)$.

Assuming that the forward voltage drops across diodes 1, 2 and 4 are $V_{BE1}$, $V_{BE2}$ and $V_{BE4}$, respectively, and the base-emitter voltage drop of transistor 3 is $V_{BE3}$, the following relationship exists:

$$V_{BE1} + V_{BE2} = V_{BE3} + V_{BE4} \tag{1}$$

However, the voltage-current relationship for a p-n junction of a semiconductor device is given by the equation:

$$V = \frac{kT}{q} \ln \frac{I}{I_s}, \tag{2}$$

in which $I_s$ is the reverse saturation current, q is the charge of an electron, k is the Boltzmann constant and T is the absolute temperature. By combining equations (1) and (2) and the aboverecited current values for diodes 1, 2 and 4 and transistor 3 when the signal current $i_s$ is not equal to zero, the following equation is obtained:

$$\frac{kT}{q}\left(\ln \frac{I_O}{I_s} + \ln \frac{I_O}{I_s}\right) = \tag{3}$$

$$\frac{kT}{q}\left[\ln \frac{(I_O - i_1)}{I_s} + \ln \frac{(I_O - i_1 + i_s)}{I_s}\right].$$

By simplifying equation (3), the following equations are obtained:

$$I_O^2 = (I_O - i_1)(I_O - i_1 + i_s) \tag{4}$$

$$i_1 = \frac{2I_O + i_s - \sqrt{4I_O^2 + i_s^2}}{2}. \tag{5}$$

If $I_O \gg i_s$, equation (5) is reduced as follows:

$$i_1 = i_s/2 \tag{6}$$

This means that the collector current of transistor 3 is equal to $$\left(I_O - \frac{i_s}{2}\right)$$

and the collector current of transistor 5 is equal to $$\left(I_O + \frac{i_s}{2}\right).$$

It should therefore be appreciated that a differential output current can be derived from the collector currents of transistors 3 and 5. However, when the condition $I_O \gg i_s$ is not satisfied, the currents produced at the collectors of transistors 3 and 5 are distorted so that a differential output current cannot accurately be derived from such currents. Further, in such case, the constant current $I_O$ cannot effectively be increased to satisfy the above condition $I_O >> i_s$.

Figure 2:
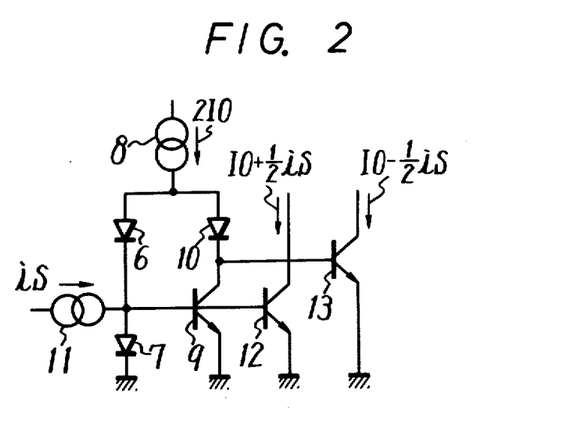
FIG. 2 is a circuit wiring diagram of another signal converting circuit according to the aforementioned copending U.S. Pat. No. 4,292,597.
Figure 3:
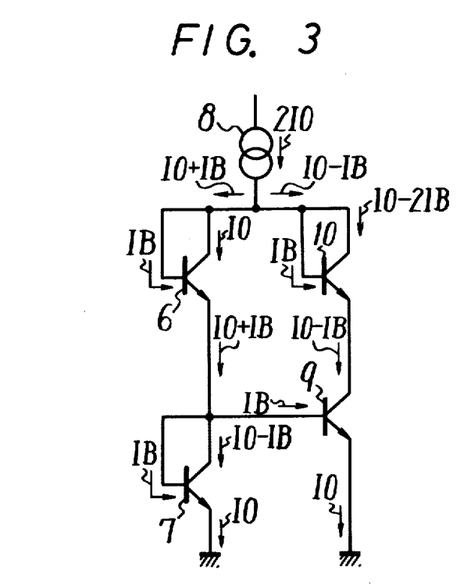
FIG. 3 is a circuit wiring diagram of a portion of the circuit of FIG. 2.

Referring now to FIG. 2, there is shown another signal converting circuit according to the aforementioned copending U.S. Pat. No. 4,292,597 which has attempted to solve the above-described difficulties encountered with the circuit of FIG. 1. The circuit of FIG. 2 is of a relatively simple construction, generates no distortion in the differential output currents and can be used with a low voltage source. In such circuit, a current source 8 generates a constant current $2I_O$. A series combination of two diodes 6 and 7, both arranged in the forward biasing direction, is connected between current source 8 and ground and another series combination of a diode 10, arranged in the forward biasing direction thereof, and the collector-emitter path of an NPN transistor 9 is connected in parallel with the first series path between current source 8 and ground. In addition, the connection point between diodes 6 and 7 is supplied with a signal current $i_s$ from a signal current source 11 and is also connected to the base of transistor 9. Such connection point is also connected to the base of a second NPN transistor 12 having its emitter connected to ground, and the collector of transistor 9 is connected to the base of a third NPN transistor 13 also having its emitter connected to ground. It should be appreciated, however, that diodes 6, 7 and 10 are preferably formed of NPN transistors having the bases thereof connected to the respective collectors, as shown in FIG. 3. Thus, diodes 6, 7 and 10 and transistors 9, 12 and 13 can be formed as an integrated circuit on a common semiconductor wafer with, for example, the emitter area of each of the elements being equal.

Theoretically, when signal current $i_s$ is equal to zero, a current $I_O$ flows through both diodes 6 and 10 from constant current source 8. When signal current $i_s$ is not equal to zero, differential output currents $$(I_O + \tfrac{1}{2} i_s) \text{ and } (I_O - \tfrac{1}{2} i_s)$$

are produced as the collector currents for transistors 12 and 13, respectively. With such an arrangement, the collector currents of transistors 12 and 13 are not distorted, even when the condition $I_O >> i_s$ is not satisfied. Further, unlike known circuits of the differential amplifier type, the prior art circuit of FIG. 2 does not require a biasing circuit so that the circuit is greatly simplified in construction and also effectively utilizes the voltage from a voltage source for transistors 12 and 13 so that only a relatively low voltage source (not shown) is required. In addition, a plurality of output transistors having their bases connected in common to that of transistors 12 and 13 can be utilized for providing a plurality of differential output signals without decreasing the signal current $i_s$.

As previously discussed, diodes 6, 7 and 10 are preferably constructed from transistors having their bases connected to the respective collectors thereof, as shown in FIG. 3. Consequently, the base currents flowing through such transistor-type diodes 6, 7 and 10 and transistor 9 have an effect on the value of the differential currents produced at the collectors of transistors 12 and 13. For example, although the same current $I_O$ theoretically flows equally through diodes 6 and 10 when the signal current $i_s$ is equal to zero, in actuality, the current flowing through diodes 6 and 10 is different as a result of the base currents flowing through diodes 6, 7 and 10 and through transistor 9. This can more readily be seen by the following analysis taken with reference to FIG. 3.

As shown therein, each of diodes 6, 7 and 10 is constructed from a transistor having the collector and base thereof connected together, as previously discussed. It is first assumed that the current flowing through diode 7, and more particularly, through the emitter leg thereof, is equal to $I_O$. Assuming that all of the transistors are constructed alike, the base-emitter voltage $V_{BE7}$ of diode 7 is equal to the base-emitter voltage $V_{BE9}$ of transistor 9, and therefore, the current through the emitter leg of transistor 9 is also equal to $I_O$. It should be appreciated that the base currents for diodes 6, 7 and 10 and transistor 9 are small compared to the collector and emitter currents thereof and can therefore, for practical purposes, be assumed to be equal to $I_B$. Thus, the collector currents of diode 7 and transistor 9 each are equal to $(I_O - I_B)$ since the collector current of a transistor is equal to the sum of the base and emitter currents thereof. The current flowing through the emitter leg of diode 6 is thus equal to $(I_O + I_B)$ and the current flowing through the emitter leg of diode 10 is equal to $(I_O - I_B)$. Thus, the current flowing to the series combination of diodes 6 and 7 from current source 8 is equal to $(I_O + I_B)$ and the current flowing to the series combination of diode 10 and transistor 9 is equal to $(I_O - I_B)$ so that an off-set current of $2I_B$ is generated between the currents flowing through diodes 6 and 10. It should therefore be appreciated that the currents produced at the collectors of transistors 12 and 13 include an undesirable off-set current which is a function of the base current of diodes 6, 7 and 10 and transistor 9.

Figure 4:
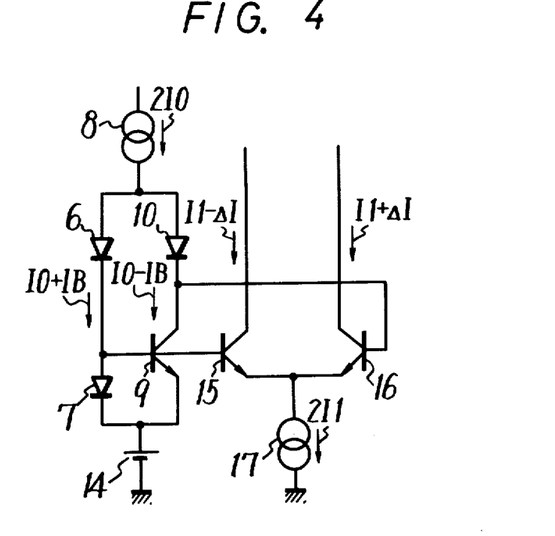
FIG. 4 is a modified circuit wiring diagram of the circuit of FIG. 2.

Referring now to FIG. 4, there is shown a modification of the circuit of FIG. 2 in which transistors 15 and 16 form a differential amplifier and correspond to transistors 12 and 13, respectively, of FIG. 2. A constant current source 17 which generates a constant current $2I_1$ is commonly connected between the emitters of transistors 15 and 16 and ground and a bias voltage source 14 is connected between the commonly connected emitters of diode 7 and transistor 9, and ground. This latter bias voltage source 14 ensures operation of constant current source 17 for the differential amplifier comprised of transistors 15 and 16. In this arrangement, the differential currents flowing through diodes 6 and 10 are applied to the bases of transistors 15 and 16. However, as previously described in regard to FIG. 2, an off-set current, which is a function of the base current of diodes 6, 7 and 10 and transistor 9, is generated at the collectors of transistors 15 and 16. When the signal current $i_s$ is equal to zero, the theoretical collector currents at transistors 15 and 16 should each be equal to $I_1$. However, because of such off-set current $\Delta I$, the currents at the collectors of transistors 15 and 16 are off-set by such off-set current. In particular, as shown in FIG. 4, as a result of such off-set current $\Delta I$, the current flow through the collector of transistor 15 is equal to $(I_1 - \Delta I)$ and the current flow through the collector of transistor 16 is equal to $(I_1 + \Delta I)$.

Given that the base-emitter voltages of diodes 6 and 10 and transistors 15 and 16 are $V_{BE6}$, $V_{BE10}$, $V_{BE15}$ and $V_{BE16}$, respectively, the following equation can be obtained:

$$V_{BE6} + V_{BE15} = V_{BE10} + V_{BE16} \quad (7)$$

Combining equation (7) with equation (2) and substituting the current values through diodes 6 and 10 and transistors 15 and 16 when $i_s=0$, the following equation is obtained:

$$\frac{kT}{q}\left(\ln\frac{I_O+I_B}{I_s}+\ln\frac{I_1-\Delta I}{I_s}\right)= \tag{8}$$

$$\frac{kT}{q}\left(\ln\frac{I_O-I_B}{I_s}+\ln\frac{I_1+\Delta I}{I_s}\right).$$

From equation (8), the following equations are obtained:

$$(I_O+I_B)(I_1-\Delta I)=(I_O-I_B)(I_1+\Delta I) \tag{9}$$

$$\Delta I=\frac{I_B\cdot I_1}{I_O}. \tag{10}$$

It should therefore be appreciated that the off-set current $\Delta I$ is a function of the base current $I_B$ through diodes 6 and 10 and such off-set current $\Delta I$ is generated in the DC differential output currents at the collectors of transistors 15 and 16. Such off-set current $\Delta I$ is, of course, undesirable. Further, as will be described later in regard to the embodiments of the present invention, the gain of the signal converting circuit can be controlled by changing the values of $I_1$ and $I_O$. With the circuit of FIG. 4, however, such variation in gain will also vary the value of the off-set current $\Delta I$.

Figure 5:
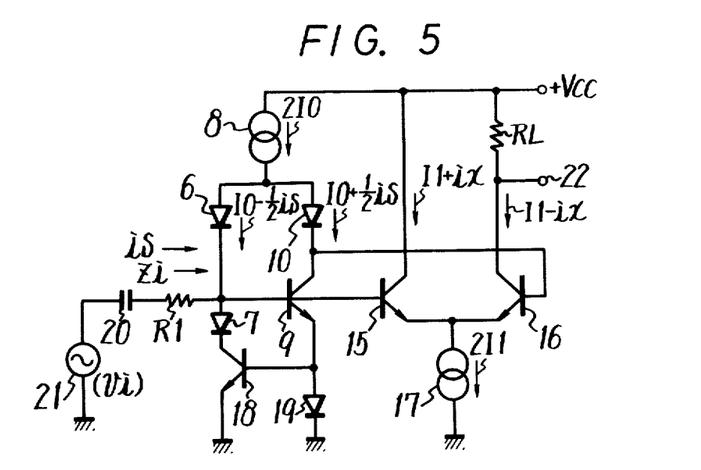
FIG. 5 is a circuit wiring diagram of a signal converting circuit according to one embodiment of this invention.

Referring now to FIG. 5, one embodiment of a signal converting circuit according to this invention will now be described, with elements corresponding to those described above with reference to the circuits of the aforementioned copending U.S. Pat. No. 4,292,597 of FIGS. 2-4 being identified by the same reference numerals. As shown therein, a first series combination of diodes 6 and 7 and the collector-emitter path of a transistor 18 are connected between a current source 8 which generates a constant current $2I_O$, and ground. In particular, the emitter of transistor 18 is connected to ground, the collector of transistor 18 is connected to the cathode of diode 7, the anode of diode 7 is connected to the cathode of diode 6 and the anode of diode 6 is connected to constant current source 8 which, in turn, is connected to a voltage source $+V_{CC}$. A second series combination of a diode 10, the collector-emitter path of an NPN transistor 9 and a diode 19 is connected in parallel with the first series combination between constant current source 8 and ground. In this second series combination, the anode of diode 10 is connected to constant current source 8, the cathode thereof is connected to the collector of transistor 9, the emitter of transistor 9 is connected to the anode of diode 19 and the cathode of diode 19 is connected to ground. Further, the connection point between diodes 6 and 7 is connected to the base of transistor 9. Such connection point is also supplied with a signal current $i_s$ and, in particular, is connected to a voltage source 21 which generates a signal voltage $v_i$ through a capacitor 20 and resistor $R_1$. The signal voltage $v_i$ is converted to a signal current $i_s$ by resistor $R_1$ and the input impedance $Z_i$ if the circuit viewed from voltage source 21. Further, the connection point between transistor 9 and diode 19 is connected to the base of transistor 18. The circuit of FIG. 5 further includes a differential amplifier comprised of two NPN transistors 15 and 16 which are connected in an identical manner to the identically-numbered transistors of FIG. 4. In particular, the emitters thereof are connected to ground through a constant current source 17 which generates a constant current $2I_1$, the collector of transistor 15 is directly connected to voltage source $+V_{CC}$ and the collector of transistor 16 is connected through a load resistor $R_L$ to voltage source $+V_{CC}$, whereby an output terminal 22 from the collector of transistor 16 produces a differential output signal. In addition, the base of transistor 15 is connected to the connection point between diodes 6 and 7 and the base of transistor 16 is connected to the collector of transistor 9, as previously described in regard to the circuit of FIG. 4. It should be appreciated that constant current source 17 can be operated without providing a special bias voltage source, as required in FIG. 4, as a result of the voltage drop created at the connection point of diodes 6 and 7 due to the base-emitter voltage drops ($V_{BE9}+V_{BE19}$) across transistor 9 and diode 10. It should also be realized that, as in the previously-described prior art circuits, diodes 6, 7, 10 and 19 preferably formed from transistors, each having its base connected to its collector, whereby diodes 6, 7, 10 and 19 and transistors 9, 15, 16 and 18 can be formed as an integrated circuit on a common semiconductor wafer in which the emitters thereof are preferably selected to have equal areas.

Figure 7:
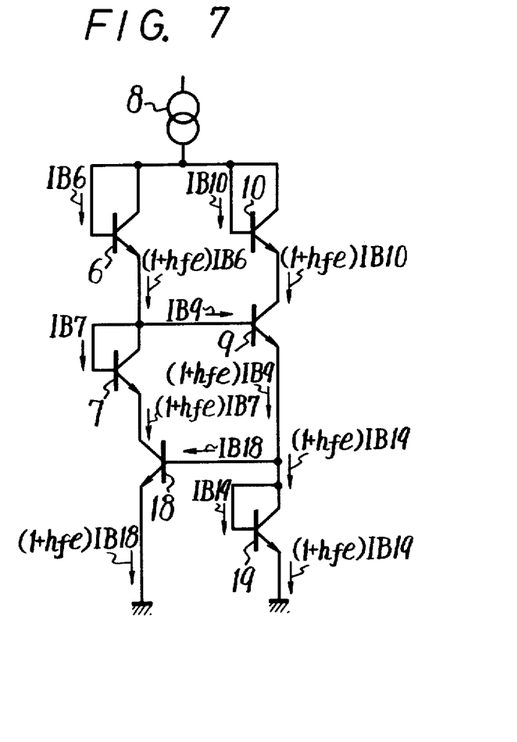
FIG. 7 is a circuit wiring diagram of a portion of the circuit of FIG. 5 and which is used for further explaining the operation thereof.

It will first be shown, with reference to FIG. 7, that the base currents through the transistors of diodes 6, 7, 10 and 19 and through transistors 9 and 18 are substantially equal to a current value $I_B$. The above assumption is based on the fact that all transistors used have the same current amplification factor $h_{fe}$ and that the value of the current amplification factor $h_{fe}$ is much greater than 1. Further, the following analysis is based on the fact that, for each transistor, the collector current $I_C=h_{fe}\cdot I_B$ and the emitter current $I_E=(1+h_{fe})I_B$, where $I_B$ is the base current for each transistor.

Referring to FIG. 7, it is seen that the emitter of diode 10 is connected directly to the collector of transistor 9 so that the emitter current of diode 10 is equal to the collector current of transistor 9, as follows:

$$(1+h_{fe})I_{B10}=h_{fe}I_{B9} \tag{11}$$

However, it should be appreciated that the value of $h_{fe}$ is much greater than 1 so that the emitter current of transistor 10 can be approximated as $h_{fe}I_{B10}$. In such case, it is seen that $I_{B10}\approx I_{B9}$. Further, since the base-emitter voltage drops across transistor 18 and diode 19 are equal, the emitter current of transistor 18 is equal to that of diode 19, as follows:

$$(1+h_{fe})I_{B19}=(1+h_{fe})I_{B18} \tag{12}$$

Thus, from equation (12), it is seen that $I_{B18}=I_{B19}$.

If the currents at the connection point between the emitter of transistor 9 and base of transistor 18 are added, the following equation can be obtained:

$$(1+h_{fe})I_{B19}+I_{B18}=(1+h_{fe})I_{B9} \tag{13}$$

Substituting equation (12) into equation (13) and rearranging the terms thereof, the relationship between $I_{B9}$ and $I_{B18}$ is obtained as follows:

$$I_{B9}=\frac{(2+h_{fe})}{(1+h_{fe})}I_{B18}. \tag{14}$$

Since $h_{fe}$ is much greater than 2, it is seen from equation (14) that $I_{B18} \cong I_{B9}$. Further, the collector current of transistor 18 is equal to the emitter current of diode 7 so that:

$$(1+h_{fe})I_{B7} = h_{fe}I_{B18} \quad (15).$$

Since $h_{fe}$ is much greater than 1, $I_{B7} \cong I_{B18} \cong I_{B9}$. If the currents at the connection point between the emitter of diode 6, collector of diode 7 and base of transistor 9 are added, it is seen that the base currents $I_{B7}$ and $I_{B9}$ for diode 7 and transistor 9 cancel so that the following equation results:

$$(1+h_{fe})I_{B6} = h_{fe}I_{B7} \quad (16).$$

Therefore, since $h_{fe}$ is much greater than 1, $I_{B6} \cong I_{B7}$. It should therefore be appreciated that the base currents of all of the transistors used for diodes 6, 7, 10, and 19 and transistors 9 and 18 are substantially equal to $I_B$.

When the signal current $i_s$ is equal to zero, the currents flowing from current source 8 to diodes 6 and 10 are both equal to $I_O$. In other words, the base currents through diodes 6, 7, 10 and 19 and transistors 9 and 18 have no effect on the current supplied to diodes 6 and 10 as was the case in the circuits of the aforementioned copending U.S. Pat. No. 4,292,597 of FIGS. 2 and 4. This may be readily shown by using the same analysis as was done in FIG. 3 in which the current through the emitter leg of transistor 18 is assumed to be equal to $I_O$. Accordingly, it should be appreciated that the differential output currents produced by the signal converting circuit of FIG. 5 do not contain any off-set current which is a function of the base current of the transistors used in the circuit.

Figure 6:
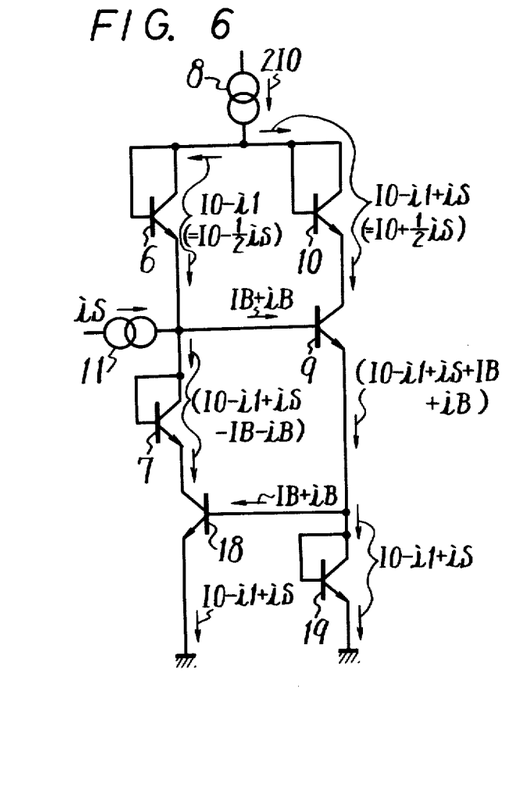
FIG. 6 is a circuit wiring diagram of a portion of the circuit of FIG. 5 and which is used for explaining the operation thereof.

Referring to FIG. 6, it will now be shown that differential currents $$(I_O - \tfrac{1}{2} i_s) \text{ and } (I_O + \tfrac{1}{2} i_s)$$

flow through diodes 6 and 10, respectively, when the signal current $i_s$ is not equal to zero and such currents are not affected by the base currents through the transistors of the circuit. Signal current $i_s$, as previously described, is generated by input voltage $v_i$ from source 21 which is converted into signal current $i_s$ by resistor $R_1$ and an input impedance $Z_i$ viewed from the signal source and looking into the circuit of FIG. 5. Such signal current $i_s$ is supplied to the connection point between diodes 6 and 7.

Assuming that signal current $i_s$ is supplied from a signal current source 11 to the connection point of diodes 6 and 7 (FIG. 6), the addition of such current at the connection point results in the constant current $I_O$ flowing through diode 6 being reduced to $(I_O - i_1)$. Further, as a result of such signal current, the base current of transistor 9 is increased to $(I_B + i_B)$. From these current values, the current flowing through diode 7 can be calculated as $(I_O - i_1 + i_s - I_B - i_B)$. Since the base current of the transistors are equal, the current flowing through the base of transistor 18 is equal to $I_B + i_B$. For bipolar junction transistor 18, the emitter current is equal to the base current plus the collector current. Therefore, since the collector current of transistor 18 is equal to the current flowing through diode 7, the emitter current flowing through transistor 18 is equal to $(I_O - i_1 + i_s)$. The same current must therefore flow through diode 19 since the base-emitter path of transistor 18 is in parallel with diode 19. Accordingly, the emitter current of transistor 9 can be calculated as $(I_O - i_1 + i_s + I_B + i_B)$ by adding the currents at the connection point between the emitter of transistor 9 and the base of transistor 18. This means that the collector current of transistor 9 is equal to $(I_O - i_1 + i_s)$. However, the total current flowing through diodes 6 and 10 must be equal to the current $2I_O$ supplied thereto so that the following relationship is obtained:

$$(I_O - i_1) + (I_O - i_1 + i_s) = 2I_O \quad (17).$$

From equation (17), it should therefore be appreciated that $i_1 = \tfrac{1}{2} i_s$. Therefore, the differential currents flowing through diodes 6 and 10 are equal to $(I_O - \tfrac{1}{2} i_s)$ and $(I_O + \tfrac{1}{2} i_s)$, respectively, and such differential currents are not affected by undesirable base currents flowing through the transistors in the circuit of FIG. 5, as was the case in the circuits of the aforementioned copending U.S. Pat. No. 2,292,597 of FIGS. 2 and 4.

It should be noted that when the differential currents are supplied to the bases of transistors 15 and 16 of the next stage, the emitter current of transistor 9 and the current flowing through diode 7 are affected by such base currents so as to differ slightly from the currents shown in FIG. 6. However, the differential output currents produced at the collectors of transistors 15 and 16 are not affected to any great extent, if at all, by such slight change in the currents through diode 7 and the emitter of transistor 9.

Further, it should be appreciated that diode 7 may be eliminated from the circuit of FIG. 5 and the resulting circuit would provide substantially identical operation to the circuit of FIG. 5. In such case, the potential at the base of transistor 9 would be equal to the potential at the collector thereof, but the potential at the base of transistor 18 would be different from that at the collector thereof, the latter difference corresponding to the base-emitter voltage drop across transistor 9. In such case, transistors 9 and 18 would not operate with the same conditions as in the circuit of FIG. 5, although the current relationships shown in FIG. 6 would remain the same so that the differential output currents produced at the collectors of transistors 15 and 16 would be the same as those in the circuit of FIG. 5.

Referring back to FIG. 5, the following equation can be obtained:

$$V_{BE6} + V_{BE15} = V_{BE10} + V_{BE16} \quad (18),$$

where $B_{BE6}$, $V_{BE10}$, $V_{BE15}$ and $V_{BE16}$ are the base-emitter voltage drops across diodes 6 and 10 and transistors 15 and 16. If it is assumed that the collector currents of transistors 15 and 16 change to $(I_1 + i_x)$ and $(I_1 - i_x)$, respectively, as a result of the generation of signal current $i_s$, the combination of equations (2) and (18) results in the following equation:

$$\frac{kT}{q} \ln \frac{(I_O - \tfrac{1}{2}i_s)}{I_s} + \frac{kT}{q} \ln \frac{(I_1 + i_x)}{I_s} = \quad (19)$$

$$\frac{kT}{q} \ln \frac{(I_O + \tfrac{1}{2}i_s)}{I_s} + \frac{kT}{q} \ln \frac{(I_1 - i_x)}{I_s}.$$

Equation (19) can be reduced as follows:

$$(I_O - \tfrac{1}{2} i_s)(I_1 + i_x) = (I_O + \tfrac{1}{2} i_s)(I_1 - i_x) \quad (20)$$

-continued $$i_x = \frac{I_1}{2I_O} i_s \qquad (21)$$

It should be appreciated from the above that the differential output currents produced at the collectors of transistors 15 and 16 depend only on the constant currents $I_0$ and $I_1$ and the signal current $i_s$, and are not dependent on the base currents of the transistors of the signal converting circuit of FIG. 5.

Accordingly, a voltage change $v_0$ in the output signal voltage at output terminal 22 can be detected and is expressed by the following equation:

$$v_O = R_L i_x = \frac{I_1}{2I_O} R_L \cdot i_s \qquad (22)$$

The input impedance $Z_i$ looking into the signal converting circuit from resistor $R_1$ can be expressed as follows:

$$Z_i = \frac{\partial V}{\partial i_s} = \frac{\partial}{\partial i_s}\left[\frac{kT}{q} \ln \frac{I_O + \frac{1}{2}i_s}{I_s}\right] = \qquad (23)$$

$$\frac{kT}{q} \cdot \frac{1}{2I_s} \cdot \frac{I_s}{I_O + \frac{1}{2}i_s} = \frac{kT}{q} \cdot \frac{1}{2(I_O + \frac{1}{2}i_s)}.$$

If $I_0$ is much greater than $i_s$, the expression for $Z_i$ can be reduced as follows:

$$Z_i = \frac{1}{2} \frac{kT}{qI_O} = \frac{r_e}{2}. \qquad (24)$$

Accordingly, the following simplified expressions can be obtained for signal current $i_s$ and output voltage $v_0$:

$$i_s = \frac{v_i}{R_1 + \frac{1}{2}r_e} \qquad (25)$$

$$v_O = \frac{R_L}{2\left(R_1 + \frac{r_e}{2}\right)} \cdot \frac{I_1}{I_O} v_i. \qquad (26)$$

It should be apparent from equations (25) and (26) that the gain control for the circuit of FIG. 5 can be carried out by varying either one or both of the constant current values $I_0$ and $I_1$.

Accordingly, it should be appreciated that the signal converting circuit of FIG. 5 produces differential output currents which do not include any off-set current which is a function of the base currents of the transistors utilized therein. Further, the circuit of FIG. 5 produces differential output currents which have substantially no distortion. In addition, it should be appreciated that no bias voltage source is required with the signal converting circuit of FIG. 5 since such circuit does not convert a signal voltage to a signal current as in prior art signal converting circuits of the differential amplifier type. Thus, the circuit according to the present invention has a relatively simplified construction and the gain control operation thereof can be satisfactorily performed with a low voltage source $+V_{CC}$. Further, since the input signal used in the present invention is processed only as a current, the dynamic range of the circuit can be made greater and the frequency characteristic thereof can be enhanced. It should also be understood from equation (26) that the effect of the input impedance on the gain of the circuit according to this invention can be reduced whereby the gain of the circuit can be easily controlled.

Figure 8:
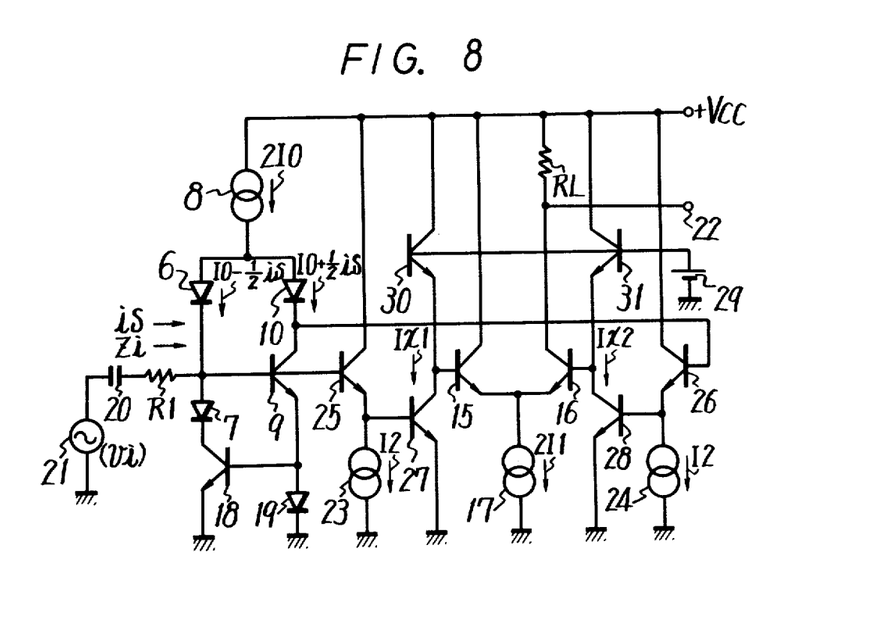
FIG. 8 is a circuit wiring diagram of another embodiment of a signal converting circuit according to this invention.

Referring now to FIG. 8, there is shown a signal converting circuit according to another embodiment of this invention, in which elements corresponding to those described above with reference to the circuit of FIG. 5 are identified by the same reference numerals. In the circuit of FIG. 8, an NPN transistor 25 has its base connected to the connection point between diodes 6 and 7 and its emitter connected to ground through a constant current source 23 which generates a constant current $I_2$. A second NPN transistor 27 has its base connected to the emitter of transistor 25, and its collector-emitter path connected in series with the collector-emitter path of an NPN transistor 30 between voltage source $+V_{CC}$ and ground. The base of transistor 30 is connected to a bias voltage source 29 which generates a predetermined voltage and the collector of transistor 27 is connected to the base of transistor 15 rather than the base of transistor 15 being connected to the connection point between diodes 6 and 7 as in the circuit of FIG. 5. In like manner, an identical circuit is utilized with transistor 16. In particular, an NPN transistor 26 has its base connected to the connection point between transistor 9 and diode 10 and thus has the other differential current supplied thereto. The emitter of transistor 26 is connected to ground through a constant current source 24 which generates the same constant current $I_2$. Another NPN transistor 28 has its collector-emitter path connected in series with the collector-emitter path of a transistor 31 between voltage source $+V_{CC}$ and ground and has its base connected to the emitter of transistor 26. The base of transistor 31 is also supplied with the predetermined voltage from bias voltage source 29 and the collector of transistor 28 is connected to the base of transistor 16 for driving the same. The remaining components of the circuit of FIG. 8 are identical to those in the circuit of FIG. 5 and will not be repeated herein.

Assuming that the differential currents produced at the collectors of transistors 27 and 28 are $I_{x1}$ and $I_{x2}$, respectively, and the base-emitter voltages of transistors 25, 26, 27 and 28 are $V_{BE25}$, $V_{BE26}$, $V_{BE27}$ and $V_{BE28}$, respectively, the following equation can be obtained:

$$V_{BE6} + V_{BE25} + V_{BE27} = V_{BE10} + V_{BE26} + V_{BE28} \qquad (27)$$

Substituting the above-recited current values and combining equations (2) and (28), equation (28) can be simplified in much the same manner as equation (18) was simplified to equation (20), as follows:

$$(I_O - \tfrac{1}{2} i_s) I_2 \cdot I_{x1} = (I_O + \tfrac{1}{2} i_s) I_2 \cdot I_{x2} \qquad (28)$$

By further simplifying equation (28), the relative values of $I_{x1}$ and $I_{x2}$ can be obtained as follows:

$$I_{x1} = I_O + \tfrac{1}{2} i_s \qquad (29)$$

$$I_{x2} = I_O - \tfrac{1}{2} i_s \qquad (30)$$

It should therefore be appreciated from equations (29) and (30) that the collector currents of transistors 27 and 28 in the circuit of FIG. 8 are the differential currents supplied to the differential amplifier comprised of transistors 15 and 16. Thus, an output voltage $v_0$ can be obtained from output terminal 22 in the same manner as similarly discussed in regard to the circuit of FIG. 5.

Figure 9:
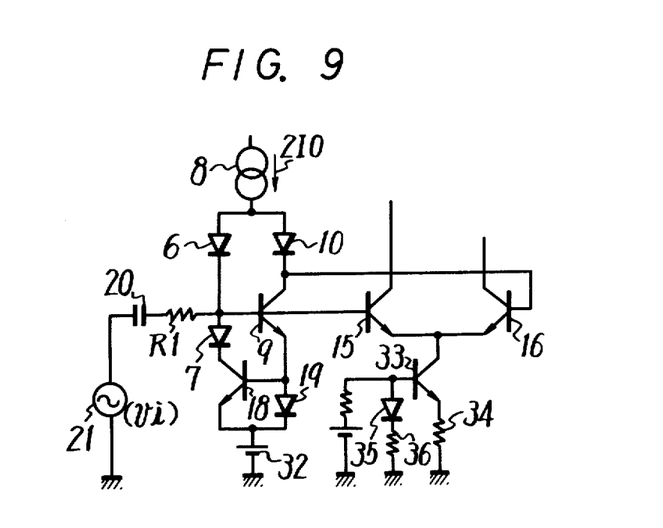
FIG. 9 is a circuit wiring diagram of still another embodiment of a signal converting circuit according to this invention.

Referring now to FIG. 9, there is shown a signal converting circuit according to still another embodiment of this invention, in which elements corresponding to those described above with reference to the circuit of FIG. 5 are identified by the same reference numerals. In this embodiment, the emitter of transistor 18 and the cathode of diode 19 are connected at a common connection point and a bias voltage source 32 is connected between this common connection point and ground. The circuit of FIG. 9 further includes a constant current source comprised of an NPN transistor 33 having its collector connected to the emitters of transistors 15 and 16, its emitter connected to ground through a resistor 34, and its base connected to ground through a first series path of a diode 35 and a resistor 36 and through a second series path in parallel with the first path and which is comprised of a resistor and a voltage source. Resistors 34 and 36 are utilized to maintain an appropriate current balancing relation between transistor 33 and diode 34. It should be appreciated that the utilization of bias voltage source 32 allows the aforementioned current source of FIG. 9 to be utilized with the differential amplifier comprised of transistors 15 and 16. A modification of the circuit of FIG. 9 may be in the utilization of a resistor having a relatively large resistance connected in parallel with the first and second paths between the base of transistor 33 and ground. It should further be appreciated that the circuits shown in FIGS. 8 and 9 produce the same results as the circuit of FIG. 5 so that the differential output currents do not include any off-set current which is a function of the base currents of the transistors utilized in the circuits.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A signal converting circuit comprising:
current source means for generating a constant current;
input signal generating means for generating an input signal current;
first means for producing a first differential current as a function of said constant current and said input signal current;
second means for producing a second differential current as a function of said constant current and said input signal current;
at least one of said first and second means including semiconductor means having an input and supplied with a current at said input;
output means for producing differential output signals in response to said first and second differential currents; and
means for eliminating the effect on said differential output signals of said current at the input of said semiconductor means.

2. A signal converting circuit according to claim 1; in which said means for eliminating includes second semiconductor means connected between said first and second means and a reference potential.

3. A signal converting circuit according to claim 2; in which said second semiconductor means includes a first transistor connected between said first means and said reference potential and a first diode connected between said second means and said reference potential.

4. A signal converting circuit according to claim 3; in which said first transistor is an NPN bipolar junction transistor having a base, an emitter connected to said reference potential, and a collector connected to said first means; and said first diode has a cathode connected to said reference potential and an anode connected to said second means and to the base of said first transistor.

5. A signal converting circuit according to claim 1; in which said output means includes differential amplifier means having first and second transistors with said first transistor having an input connected to said first means and said second transistor having an input connected to said second means.

6. A signal converting circuit according to claim 5; in which said first and second transistors are NPN bipolar junction transistors and said differential amplifier means further includes a second constant current source connected between the emitters of said first and second transistors and a reference potential.

7. A signal converting circuit according to claim 5; in which said differential amplifier means further includes second constant current source means for biasing said first and second transistors, and a bias voltage source connected to said means for eliminating.

8. A signal converting circuit according to claim 7; in which said second constant current source means includes a transistor having a collector connected to said first and second transistors, an emitter connected to a reference potential, and a base connected to a second bias voltage source.

9. A signal converting circuit according to claim 1; in which each of said first and second means is connected between said current source means and said means for eliminating and each of said first and second means is further supplied with said input signal current for producing said first and second differential currents, respectively.

10. A signal converting circuit according to claim 9; in which said first means includes first diode means connected to said current source means and said input signal generating means for producing said first differential current, and said second means includes a series combination of first transistor means and second means, said series combination being connected to said current source means and said input signal generating means for producing said second differential current.

11. A signal converting circuit according to claim 10; in which said first diode means includes a first diode having an anode connected to said current source means and a cathode connected to said input signal generating means and to said means for eliminating, said second diode means includes a second diode having a cathode and an anode connected to said current source means, and said transistor means includes an NPN bipolar junction transistor having a collector connected to the cathode of said second diode, a base connected to the cathode of said first diode and to said input signal generating means, and an emitter connected to said means for eliminating.

12. A signal converting circuit according to claim 11; in which said first and second diodes are constructed from NPN bipolar junction transistors with each transistor having the base thereof connected to its respective collector.

13. A signal converting circuit comprising:

current source means for generating a constant current;

input signal generating means for generating an input signal current;

first means for producing a first differential current as a function of said constant current and said input signal current;

second means for producing a second differential current as a function of said constant current and said input signal current;

at least one of said first and second means including semiconductor means having an input and supplied with a current at said input;

output means for producing differential output signals in response to said first and second differential currents; and means for eliminating the effect on said differential output signals of said current at the input of said semiconductor means, said means for eliminating including second semiconductor means connected between said first and second means and a reference potential, said second semiconductor means including a first NPN bipolar junction transistor connected between said first means and said reference potential and a first diode connected between said second means and said reference potential, said NPN bipolar junction transistor having a base, an emitter connected to said reference potential, and a collector connected to said first means, and said first diode having a cathode connected to said reference potential and an anode connected to said second means and to the base of said first transistor;

said first means including a second diode having an anode connected to said current source means and a cathode connected to said input signal generating means and to the collector of said first transistor; and said second means including a third diode having a cathode and an anode connected to said current source means, and a second transistor having a collector connected to the cathode of said third diode, an emitter connected to the base of said first transistor and to the anode of said first diode, and a base connected to the cathode of said second diode, to the collector of said first transistor, and to said input signal generating means.

14. A signal converting circuit according to claim 13; in which each of said first, second and third diodes is constructed from an NPN bipolar junction transistor having the base thereof connected to its respective collector.

15. A signal converting circuit comprising:

current source means for generating a constant current;

input signal generating means for generating an input signal current;

first means supplied with said input signal current for producing a first differential current as a function of said constant current and said input signal current, said first means including first diode means connected to said current source means and said input signal generating means for producing said first differential current;

second means supplied with said input signal current for producing a second differential current as a function of said constant current and said input signal current, said second means including a series combination of first transistor means and second diode means, said series combination being connected to said current source means and said input signal generating means for producing said second differential current;

at least one of said first and second means including semiconductor means having an input and supplied with a current at said input;

output means for producing differential output signals in response to said first and second differential currents; and means for eliminating the effect on said differential output signals of said current at the input of said semiconductor means;

each of said first and second means being connected between said current source means and said means for eliminating, said first diode means including a first diode having an anode connected to said current source means and a cathode connected to said input signal generating means and to said means for eliminating, said second diode means including a second diode having a cathode and an anode connected to said current source means, said transistor means including an NPN bipolar junction transistor having a collector connected to the cathode of said second diode, a base connected to the cathode of said first diode and to said input signal generating means, and an emitter connected to said means for eliminating, and said first diode means further including a third diode having an anode connected to the cathode of said first diode, to said input signal generating means and to the base of said transistor, and a cathode connected to said means for eliminating.

16. A signal converting circuit comprising:

current source means for generating a constant current;

input signal generating means for generating an input signal current;

first means supplied with said input signal current for producing a first differential current as a function of said constant current and said input signal current, said first means including first diode means connected to said current source means and said input signal generating means for producing said first differential current, said first means further including first transistor means supplied with a second constant current and having an input connected to said first diode means for producing a second differential current;

second means supplied with said input signal current for producing a third differential current as a function of said constant current and said input signal current, said second means including a series combination of second transistor means and second diode means, said series combination being connected to said current source means and said input signal generating means for producing said third differential current, said second means further including third transistor means supplied with a third constant current and having an input connected to said series combination for producing a fourth differential current;

at least one of said first and second means including semiconductor means having an output and supplied with a current at said input;

output means for producing differential output signals in response to said first and third differential currents; and means for eliminating the effect on said differential output signals of said current at the input of said semiconductor means, each of said first and second means being connected between said current source means and said means for eliminating.

17. A signal converting circuit according to claim 16; in which said first and second differential currents are equal and said third and fourth differential currents are equal.

18. A signal converting circuit according to claim 16; in which said second transistor means includes a first transistor having an input connected to said first diode means and an output circuit supplied with said second constant current, and a second transistor having an input connected to the output circuit of said first transistor and an output circuit connected to said output means; and said third transistor means includes a third transistor having an input connected to said series combination and an output circuit supplied with said third constant current, and a fourth transistor having an input connected to the output circuit of said third transistor and an output circuit connected to said output means.

19. A signal converting circuit according to claim 18; in which said second transistor means further includes a fifth transistor having an input supplied with a predetermined voltage and an output circuit connected in series with the output circuit of said second transistor between first and second reference potentials, and said third transistor means further includes a sixth transistor having an input supplied with said predetermined voltage and an output circuit connected in series with the output circuit of said fourth transistor between said first and second reference potentials.

20. A signal converting circuit according to claim 19; in which each of said transistors of said second and third transistor means is an NPN bipolar junction transistor, wherein said first transistor has its base connected to said first diode means, its collector connected to said first reference potential, and its emitter supplied with said second constant current; said second transistor has its base connected to the emitter of said first transistor, its emitter connected to said second reference potential and its collector connected to said output means; said fifth transistor has its base supplied with said predetermined voltage, its collector connected to said first reference potential and its emitter connected to the collector of said second transistor; said third transistor has its base connected to said series combination, its collector connected to said first reference potential, and its emitter supplied with said third constant current; said fourth transistor has its base connected to the emitter of said third transistor, its emitter connected to said second reference potential and its collector connected to said output means; and said sixth transistor has its base supplied with said predetermined voltage, its collector connected to said first reference potential, and its emitter connected to the collector of said fourth transistor.

21. A signal converting circuit comprising:
first diode means;
second diode means;
first transistor means having an input and an output path connected in series with said second diode means to form a series circuit, and defining a first junction point between said second diode means and said output path;
third diode means connected between said series circuit and a reference potential so as to define a second junction point between said series circuit and said third diode means;
second transistor means having an output path connected between said first diode means and a reference potential and an input connected to said second junction point, and defining a third junction point between said first diode means and the output path of said second transistor means, the input of said first transistor means being connected to said third junction point;
current source means connected to said first diode means and said series circuit;
means for supplying a signal current to said third junction point; and
differential output means connected to said first and third junction points for producing a differential output signal as a function said signal current.

* * * * *